(12) United States Patent
Walker et al.

(10) Patent No.: US 7,256,600 B2
(45) Date of Patent: Aug. 14, 2007

(54) METHOD AND SYSTEM FOR TESTING SEMICONDUCTOR DEVICES

(75) Inventors: Ernest Walker, Weston, MA (US); Ronald A. Sartschev, Dunstable, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/018,540

(22) Filed: Dec. 21, 2004

(65) Prior Publication Data

US 2006/0132165 A1 Jun. 22, 2006

(51) Int. Cl.
*G01R 31/02* (2006.01)

(52) U.S. Cl. .................. 324/763; 324/765; 324/73.1; 714/733

(58) Field of Classification Search ............. 324/763, 324/765, 158.1, 73.1; 714/724–733
See application file for complete search history.

(56) References Cited

U.S. PATENT DOCUMENTS

| | | | |
|---|---|---|---|
| 4,947,106 A | 8/1990 | Chism | |
| 4,998,026 A | 3/1991 | King | |
| 5,101,153 A | 3/1992 | Morong, III | |
| 5,200,696 A | 4/1993 | Menis et al. | |
| 5,514,976 A | 5/1996 | Ohmura | |
| 5,521,493 A | 5/1996 | Persons | |
| 5,617,035 A | 4/1997 | Swapp | |
| 5,754,041 A | 5/1998 | Kaito et al. | |
| 6,028,439 A | 2/2000 | Arkin et al. | |
| 6,498,473 B1 | 12/2002 | Yamabe | |
| 6,574,760 B1* | 6/2003 | Mydill | 714/724 |
| 6,677,775 B2 | 1/2004 | Babcock | |
| 6,687,868 B1 | 2/2004 | Furukawa et al. | |
| 6,804,620 B1 | 10/2004 | Larson et al. | |
| 6,828,775 B2 | 12/2004 | Chow et al. | |
| 6,836,136 B2* | 12/2004 | Aghaeepour | 324/765 |
| 6,859,902 B1 | 2/2005 | Dalal et al. | |
| 6,879,175 B2 | 4/2005 | Conner | |
| 6,885,213 B2 | 4/2005 | Sunter | |
| 2005/0189950 A1 | 9/2005 | Lu | |

OTHER PUBLICATIONS

Mercury, System on a Chip, 50 MHz Octal Pin Electronics with PMU; Planet ATE; Nov. 22, 2004.
Neptune, SOC Pin Electronics Companion PMU/DAC/Resistive Load; Planet ATE; Jun. 16, 2004.
Pluto, Octal PMU/VI with Ganging 5 MHz Pin Electronics; Planet ATE; Oct. 28, 2004.
Saturn, System on a Chip, Dual Channel Wide Voltage Pin Electronics Solution; Planet ATE; Jul. 19, 2005.
Venus, System on a Chip, Dual Channel 133 MHz Pin Electronics Solution; Planet ATE; Sep. 16, 2004.
International Search Report for Application No. PCT/Us05/45605.
Written Opinion for Application No. PCT/US05/45718.

* cited by examiner

*Primary Examiner*—Ha Tran Nguyen
*Assistant Examiner*—Arleen M. Vazquez
(74) *Attorney, Agent, or Firm*—Fish & Richardson P.C.

(57) ABSTRACT

A semiconductor device tester includes a parametric measurement unit (PMU) stage for producing a DC test signal and a pin electronics (PE) stage for producing an AC test signal to test a semiconductor device. A driver circuit is capable of providing a version of the DC test signal and a version of the AC test signal to the semiconductor device.

19 Claims, 10 Drawing Sheets

METHOD AND SYSTEM FOR TESTING SEMICONDUCTOR DEVICES

TECHNICAL FIELD

This disclosure relates to testing semiconductor devices and, more particularly, to providing signals to semiconductor devices under test.

BACKGROUND

As the commercial demand for semiconductor devices (e.g., memory chips and microprocessors) increases, testing of these devices has become critical for device manufacturers. By testing semiconductor devices prior to shipping to their customers, defective or under-performing devices may be detected and removed. To perform such tests, semiconductor device testers such as automatic test equipment (ATE) may be used to characterize and validate the performance of manufactured semiconductor devices.

For some types of tests, ATE may send two types of signals to a device-under-test (DUT). Direct current (DC) signals are sent into the DUT for measuring device characteristics, such as input and output impedance, leakage current, and DUT performance. To produce and send these DC signals, the ATE includes a parametric measurement unit (PMU). The ATE also generates and sends alternating current (AC) signals to the DUT, which in some test scenarios simulate digital input signals. These simulated digital signals, for example, may be inputted into a memory chip under test. After storing the digital values represented by the digital signals, the values are retrieved (at a later time) to determine if the DUT has properly stored the values. To generate and send the AC test signals, the ATE includes additional circuitry known as Pin electronics (PE) circuitry that typically operates at higher speeds compared to the PMU circuitry.

SUMMARY OF THE DISCLOSURE

In accordance with an aspect of the disclosure, a semiconductor device tester includes a parametric measurement unit (PMU) stage for producing a DC test signal and a pin electronic (PE) stage for producing an AC test signal for testing the semiconductor device. A driver circuit is capable of providing a version of the DC test signal and a version of the AC test signal to the semiconductor device under test.

In one embodiment, the semiconductor device tester may include of an output stage for providing the versions of the test signals from the driver circuit to the semiconductor device. The driver circuit may amplify current of the DC test signal produced by the PMU stage and the AC test signal produced by the PE stage. The PMU stage may include a switch that provides another DC test signal to the output stage.

In accordance with another aspect, a semiconductor device tester includes an integrated circuit having a pin electronics (PE) stage for providing an AC test signal to a semiconductor device under test and a parametric measurement unit (PMU) stage for providing a DC test signal to the semiconductor device under test.

In one embodiment, the integrated circuit may include an output stage that is connected to the PE stage and the PMU stage and that provides the AC test signal and the DC test signal to the semiconductor device under test. The integrated circuit may include a driver circuit that is connected to the PE stage and the PMU stage and that receives the AC test signal and the DC test signal. The integrated circuit may include an output stage that is connected to the driver circuit and provides an amplified AC test signal and an amplified DC test signal to the semiconductor device under test.

In accordance with another aspect, a method of providing test signals to a semiconductor device includes producing an DC test signal with a PMU stage, amplifying current of the DC test signal with a driver circuit that amplifies an AC test signal from a PE stage, and sending the amplified DC test signal through an output stage to the semiconductor device under test. The output stage is also provides an amplified AC test signal from the PE stage to the semiconductor device.

In one embodiment, sending the amplified DC test signal through the output stage may include passing the amplified DC test signal through a resistor. The method of providing test signals to the semiconductor device may further include passing another DC test signal through a switch and sending this DC test signal through the output stage to the semiconductor device under test.

Additional advantages and aspects of the present disclosure will become readily apparent to those skilled in the art from the following detailed description, wherein embodiments of the present invention are shown and described, simply by way of illustration of the best mode contemplated for practicing the present invention. As will be described, the present disclosure is capable of other and different embodiments, and its several details are susceptible of modification in various obvious respects, all without departing from the spirit of the present disclosure. Accordingly, the drawings and description are to be regarded as illustrative in nature, and not as limitative.

DETAILED DESCRIPTION OF THE PREFERRED EMBODIMENTS

Figure 1:
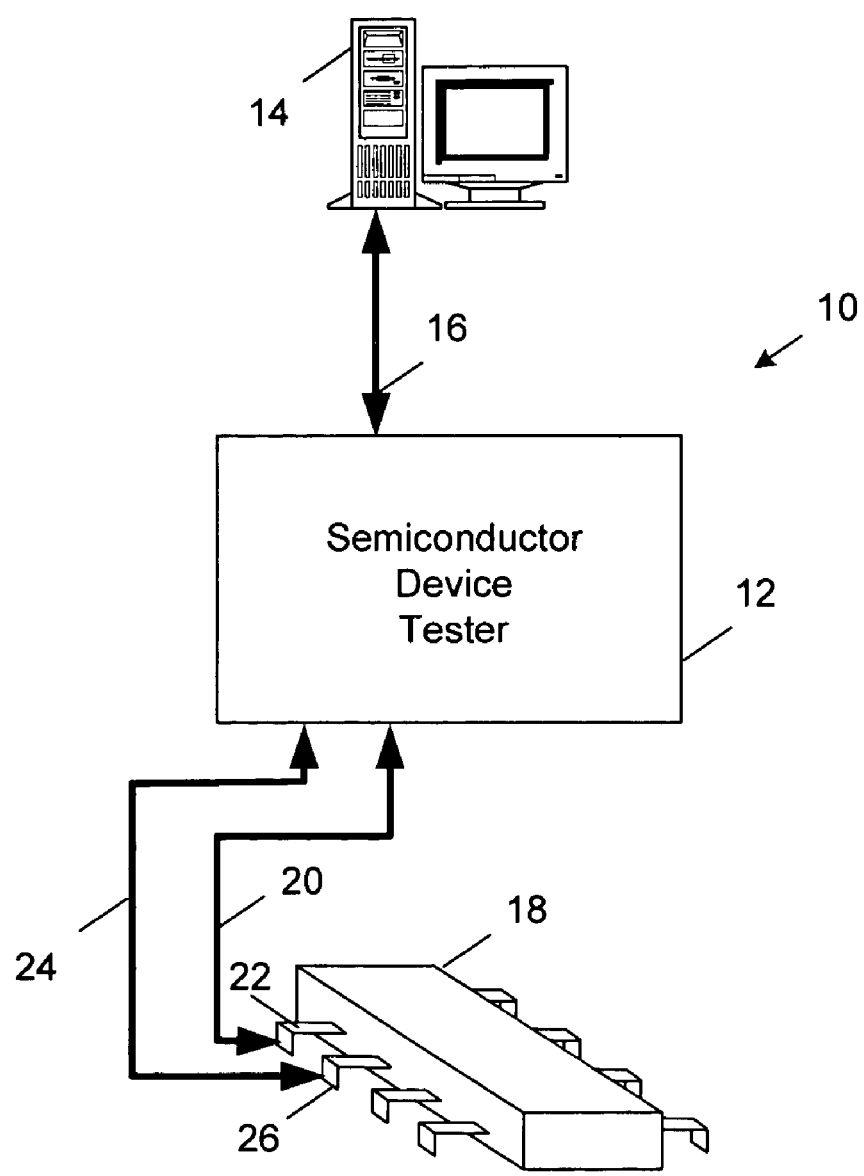
FIG. 1 is a diagrammatic view of a system for testing semiconductor devices.

Referring to FIG. 1, a system 10 for testing semiconductor devices includes a semiconductor device tester 12 such as an ATE or other similar testing device. To control semiconductor device tester 12, system 10 includes a computer system 14 that interfaces with tester 12 over a hardwire connection 16. Typically, computer system 14 sends commands to tester 12 that initiate the execution of routines and functions for testing a semiconductor device. Such test routines may initiate the generating and sending of test signals to the semiconductor device-under-test (DUT) and collecting responses from the DUT. Various types of semiconductor devices may be tested by system 10. In this example, an integrated circuit (IC) chip 18 (e.g., memory chip, microprocessor, analog-to-digital converter, digital-to-analog converter, etc.) is tested as a DUT.

To provide test signals and collect responses from the DUT, semiconductor device tester 12 is connected to one or more connector pins that provide an interface for the internal circuitry of IC chip 18. To test some DUTs, as many as 64 or 128 connector pins may be interfaced to tester 12. For illustrative purposes, in this example, semiconductor device tester 12 is connected to two connector pins of IC chip 18 via two hardwire connections. One conductor 20 is connected to a pin 22 and another conductor 24 is connected to another pin 26. By making these connections, a test signal may be injected into pin 22 by semiconductor device tester 12 and a response signal may be collected from pin 26. The collected response may then be used by tester 12 (and/or computer system 14) to characterize IC chip 18 for gain response, phase response, or other types of two port tests. Single port tests may also be performed by tester 12 on IC chip 18. For example, tester 12 may inject a test signal into pin 22 and collect a signal reflected back over conductor 20 (which also delivered the injected signal). By collecting the reflected signal, the input impedance of pin 22 may be characterized along with other single port testing quantities. Tester 12 may also generate and inject digital test vectors into one or more pins of IC chip 18 to perform other types of tests such as quantifying the storage performance of IC chip 18.

Figure 2:
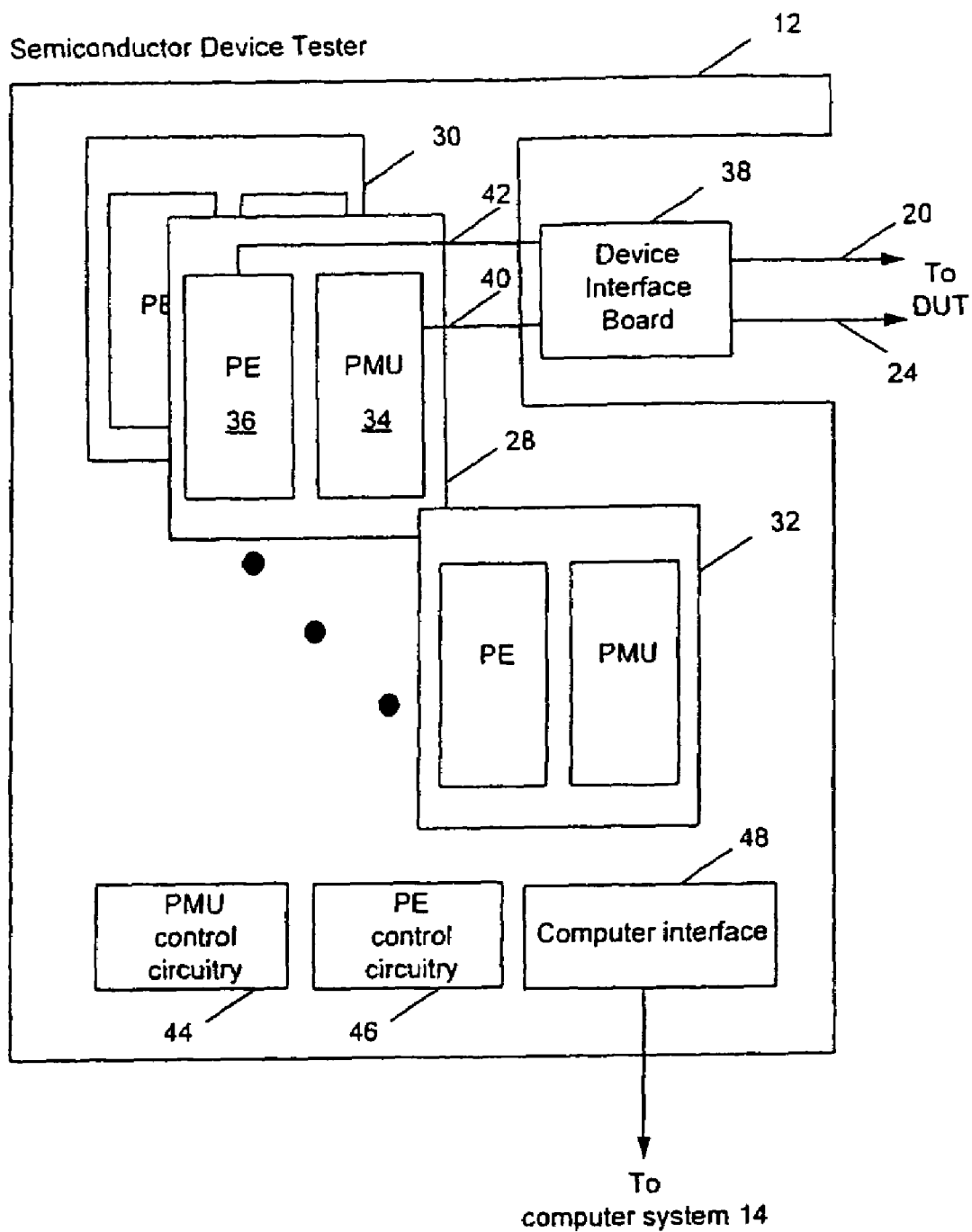
FIG. 2 is a diagrammatic view of a conventional semiconductor device tester.

Referring also to FIG. 2, to send and collect test signals from multiple connector pins of a DUT (or multiple DUTs), semiconductor device tester 12 includes an interface card 28 that is capable of communicating with numerous pins. For example, interface card 28 may initiate transmitting test signals to, e.g., 32, 64, 128 pins and collecting the corresponding responses. Each communication link to a pin is typically referred to as a channel and by providing a large number of channels, the testing time is reduced. Along with having many channels on an interface card, by including multiple interface cards in tester 12, the overall number of channels increases thereby further reducing testing time. In this example, two additional interface cards 30 and 32 are shown to demonstrate that multiple interface cards may populate tester 12.

Each interface card includes a dedicated integrated circuit (IC) chip (e.g., an application specific integrated circuit (ASIC)) for performing particular test functions. For example, interface card 28 includes IC chip 34 for performing parametric measurement unit (PMU) tests. Typically PMU testing involves providing a DC voltage or current signal to the DUT to determine input and output impedance, current leakage, and other DC performance characterizations. Interface card 28 also includes an IC chip 36 for performing pin electronics (PE) tests on DUT 18. PE testing involves sending AC test signals and AC waveforms to DUT 18 and collecting responses to further characterize the performance of the DUT. For example, IC chip 36 may initiate transmitting a vector of binary values to the DUT for storing on the DUT. Once stored, the DUT is accessed by tester 12 to determine if the correct binary values have been stored. Since digital signals typically include abrupt voltage transitions, the PE circuitry in IC chip 36 operates at a relatively high speed in comparison to the PMU circuitry in IC chip 34.

To pass both the DC and AC test signals and waveforms from interface cards 28, 30, and 32 to DUT 18, tester 12 is connected to a device interface board (DIB) 38 that places the test signals on the appropriate conductors for transmission to the DUT. DIB 38 directs test signals from IC chip 34 (that provides PMU test signals) and IC chip 36 (that provides PE test signals) to conductors 20 and 24 for delivery to respective connector pins 22 and 26 of DUT 18. In this example only two conducting traces 40, 42 respectively connect IC chips 34 and 36 to DIB 38. However, each IC chip typically has multiple conducting traces that connect to DIB 38. Additionally, in some arrangements, tester 12 may connect to two or more DIB's for interfacing the channels provided by the interface cards to the DUT or multiple devices under test.

To initiate and control the testing performed interface cards 28, 30, 32, tester 12 includes PMU control circuitry 44 and PE control circuitry 46 that provide test parameters (e.g., test signal voltage level, test signal current level, digital values, etc.) for producing test signals and analyzing DUT responses. Tester 12 also includes a computer interface 48 that allows computer system 14 to control the operations executed by tester 12 and also allows data (e.g., test parameters, DUT responses, etc.) passing between tester 12 and computer system 14.

Figure 3:
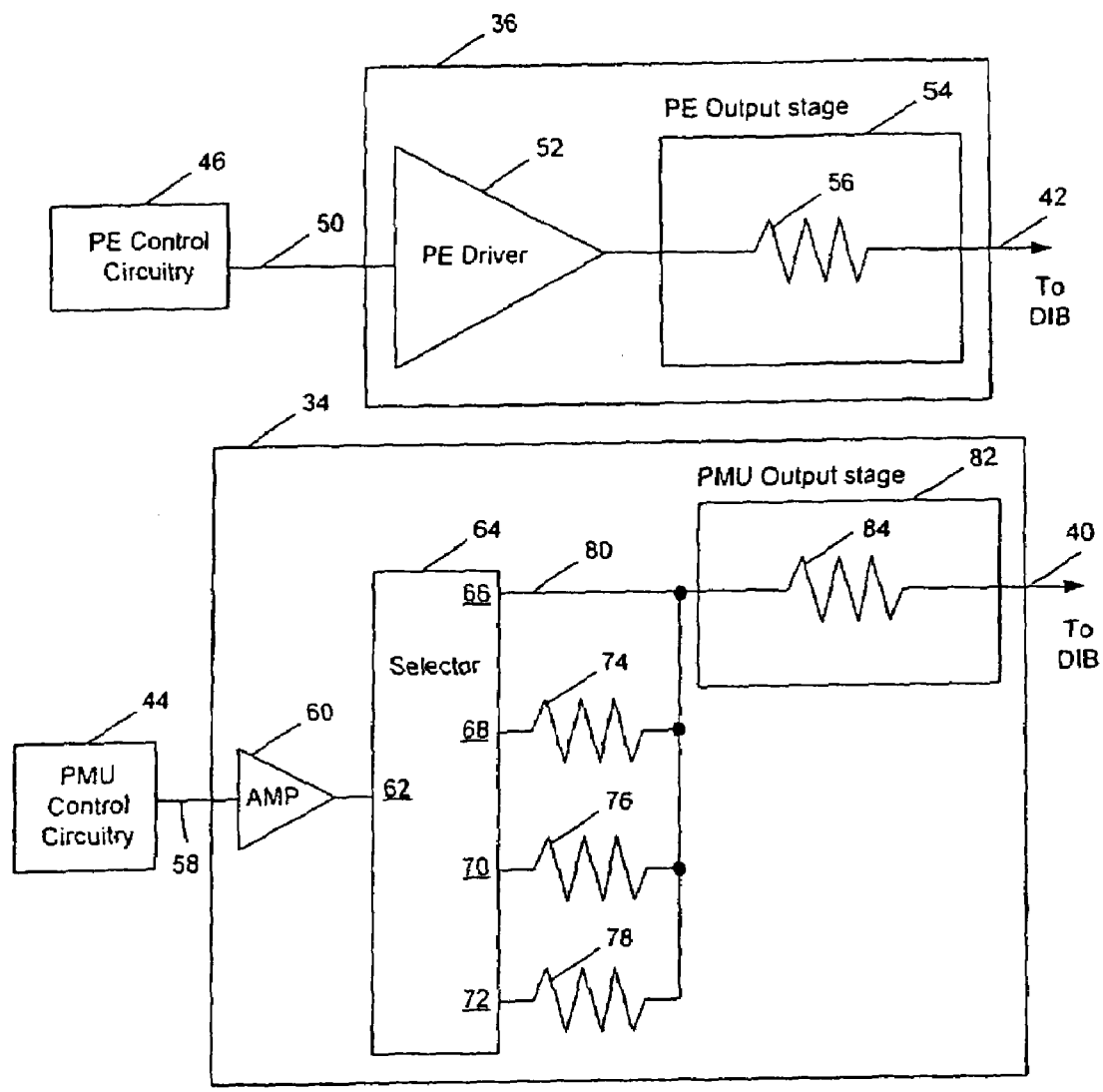
FIG. 3 is a diagrammatic view of PE and PMU circuitry in the conventional semiconductor device tester shown in FIG. 2.

Referring also to FIG. 3, portions of IC chips 34 and 36 are shown that respectively perform the PMU and PE functions. To initiate sending a PE test signal to DUT 18, PE control circuitry 46 sends a digital signal (or other type of AC waveform) over conducting trace 50 to a high-speed driver 52 that conditions (e.g., amplifies) the signal and sends it to a PE output stage 54. In this example, PE output stage 54 includes a resistor 56 that provides impedance matching for the digital signals or other types of AC test signals sent from PE output stage 54 to the DIB.

Similar to the PE function, PMU control circuitry 44 provides a signal to the IC chip 34 to initiate a PMU test. For PMU testing, a DC signal is sent over a conducting trace 58 to an amplifier 60 that conditions (e.g., amplifies) the signal. The conditioned DC signal is sent to an input port 62 of a selector 64, which in this example has four output ports 66, 68, 70, and 72. Tester 12 controls selector 64 such that the signal received on input 62 is placed on one of the output ports 66, 68, 70, or 78. For example, output ports 66, 68, 70, and 72 may respectively output PMU tests signals with current levels of 50 milliamp, 2 milliamp, 200 microamp, and 20 microamp. Some of the output ports are respectively connected to a sense resistor for measuring the current of the test signal that is placed on the corresponding port. To sense test signals placed on output ports 68, 70, and 72, respective resistors 74, 76, and 78 are connected to the corresponding ports. Typically different resistance values are chosen for resistors 74, 78, and 78 in order to sense the particular test signal propagating from the corresponding output port. Output port 66 provides higher current signals (e.g., 50 milliamp) and is connected to a conductor 80 that does not include a sense resistor.

Output ports 66, 68, 70, and 72 of selector 64 are connected to a PMU output stage 82 (via respective resistors 74, 76, 78 and conducting trace 80). Similar to PE output stage 54, PMU output stage 82 provides impedance matching by including a resistor 84 that is connected to each output port of selector 64. Resistor 84 is connected to conducting trace 40 to send the DC test signals to DIB 38.

As described, the PMU circuitry and PE circuitry are incorporated into separate IC chips 34 and 36. Additionally, the PMU circuitry and PE circuitry use separate dedicated output stages to provide test signals to the DUT. In particular, output stage 54 provides the PE test signals and output stage 82 provides PMU test signals. By using two separate IC chips to provide PE and PMU functions, precious real estate on each interface card is occupied along with associated space needed for connectors and conducting traces. Additionally, by dedicating separate output stages to both the PE and the PMU circuitry, die area on each IC chip is used for redundant output circuitry.

Figure 4:
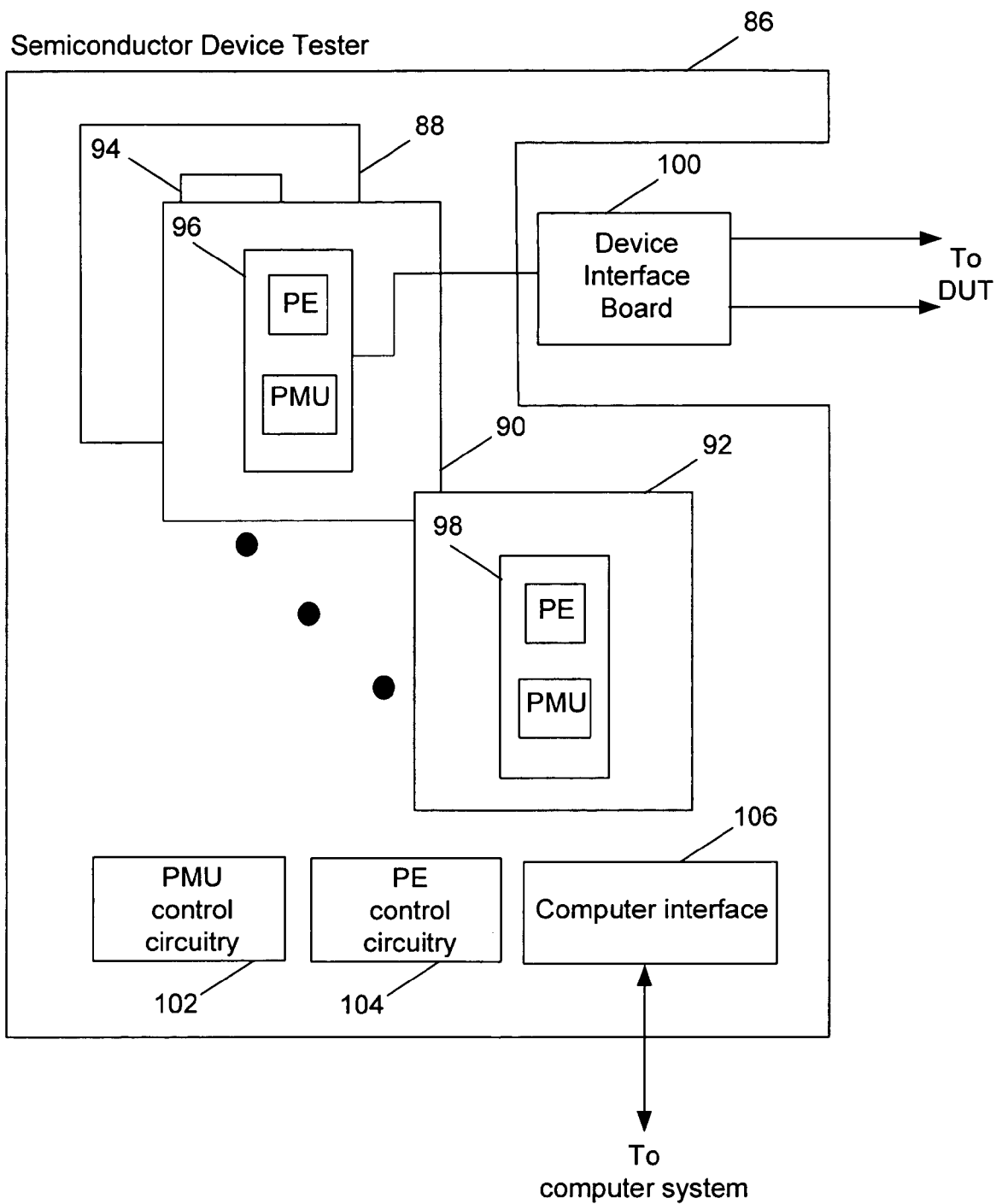
FIG. 4 is a diagrammatic view of a semiconductor device tester with PE and PMU circuitry incorporated into the same integrated circuit chips.

Referring also to FIG. 4, to reduce the occupied space on each interface card and reduce output stage redundancy, PE circuitry and PMU circuitry are incorporated in the same IC chip. Additionally, both the PE circuitry and PMU circuitry share a common output stage to reduce circuitry in each IC chip providing both PE and PMU functions. For illustrative purposes, tester 86 includes a series of interface cards 88, 90, and 92 that respectively have mounted IC chips that provide PE and PMU functions for testing of a DUT (e.g., a memory chip, a microprocessor, an analog-to-digital converter, etc.). In particular, respective IC chips 94, 96, and 98 include circuitry to provide PE and PMU test signals. By combining the PE and PMU functions on the same IC chips, the number of chips on each interface card is reduced and space on each card is conserved. This conserved space may be used, e.g., to implement additional functionality or to add more test channels to the interface cards. Furthermore, by sharing a common output stage between the PE and PMU circuitry on each IC chip, chip area previously used for redundant output stages and impedance-matching resistors is conserved. Tester 86 is connected to a device interface board 100 for directing test signal to appropriate pins of the DUT. Additionally, tester 86 includes PMU control circuitry 102, PE control circuitry 104, and a computer interface 106 for passing commands and data between tester 86 and a computer system (e.g., computer system 14).

Figure 5:
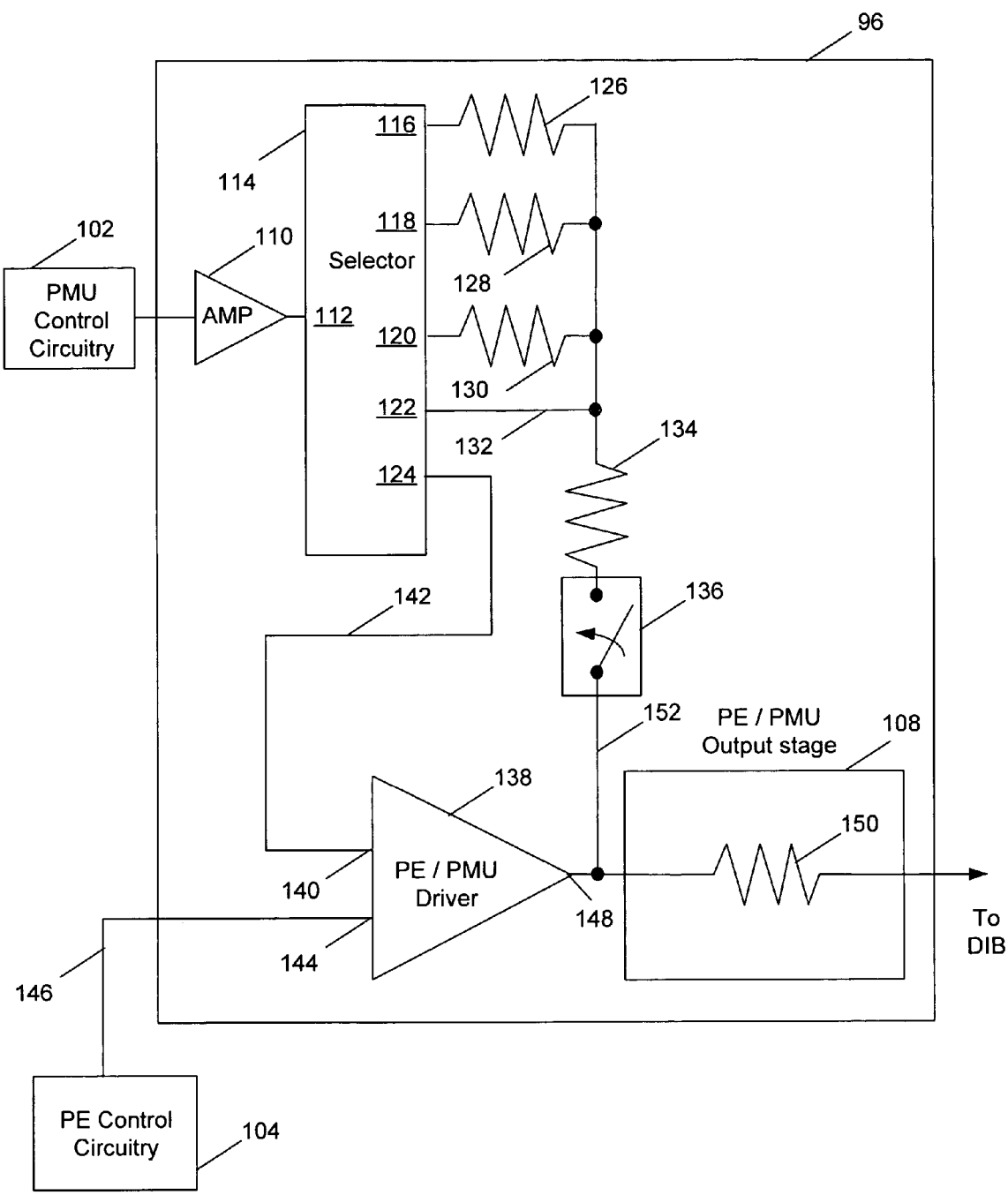
FIG. 5 is a diagrammatic view of PE and PMU circuitry that share a common output stage.

Referring also to FIG. 5, a portion of IC chip 96 is presented that includes circuitry for providing both PE and PMU test signals to a DUT. Additionally, IC chip 96 includes an output stage 108 that is shared by both the PE and PMU circuitry. By sharing common output stage 108, chip space is conserved on IC chip 96. Additionally, by implementing both functions in the same IC chip, board space is conserved on interface card 90.

Similar to the PMU function shown in FIG. 3, PMU control circuitry 102 sends a DC test signal through an amplifier 110 to an input 112 of a selector 114 that directs the signal to a particular output port. In this example, selector 112 includes five output ports 116, 118, 120, 122, and 124. Each output port is used for providing a DC test signal with a particular current level (e.g., 50 milliamp, 2 milliamp, 200 microamp, 20 microamp, 2 microamp, etc.) to the DUT. Sense resistors 126, 128, and 130 have different resistance values for sensing the particular DC test signal propagating from the corresponding output port. Output port 122 is connected conducting trace 132 (that does not include a sense resistor) for passing a DC test signal. In other arrangements, other types of resistors or resistor networks may be connected to the output ports 116, 118, 120, 122, and 124 of selector 114. For example a resistor may be inserted in series with conductor 132.

Test signals from output ports 116, 118, 120, and 122 are passed through a resistor 134 to a switch 136 that controls passage of the test signals to shared output stage 108. Switch 136 may be controlled by tester 86 or by commands sent from a computer system such as computer system 14. Typically when a PMU test is executed, switch 136 is closed. However, when a PMU signal (e.g., 50 milliamp) is provided from output port 124 switch 136 is open. Additionally, for executing a PE test, switch 136 is open. To control the position of switch 136, tester 86 may produce a voltage or current signal to initiate placing switch 136 into an open or closed position. Switch 136 may be incorporated into IC chip 96 by various techniques known in the art of semiconductor device development and production. For example, one or more transistors or other types of semiconductor components may be incorporated into IC chip 96 to produce switch 136.

To provide a relatively high-current PMU test signal, selector 114 is also connected to a PE/PMU driver 138 that amplifies the test signal. In particular output port 124 is connected to an input 140 of PE/PMU driver 138 over conductor 142. PE/PMU driver 138 is shared by both the PMU and PE circuitry that is incorporated into IC chip 96. By sharing driver 138, a PMU test signal may be amplified by the same driver used for PE test signals. For example, by amplifying a PMU test signal with driver 138, large DC current signals (e.g., 50 milliamp) may be provided to the DUT for testing. By using the same driver to produce relatively large current PMU test signals along with PE test signals, a redundant driver is not needed and chip space is conserved on IC chip 96. Additionally by using the same driver 138, power consumption is also conserved by reducing the power needs of a redundant driver.

PE control circuitry 104 provides PE test signals into another input 144 of PE/PMU driver 138 via a conductor 146. An output 148 of PE/PMU driver 138 sends the amplified PE test signal (or high current PMU test signal) to the shared output stage 108. In this arrangement, output stage 108 includes a resistor 150 for impedance matching, however, two or more resistors may be included in output stage 108. For example, resistor 150 may have a resistance of 50 Ohm for matching a transmission line that connects to the DIB.

Since the output stage 108 is shared by the PE and PMU circuitry, both PE and PMU test signals are passed through resistor 150. For example, the higher current PMU test signals and PE test signals are sent from output 148 of PE/PMU driver 138 to resistor 150. Similarly, the lower current PMU test signals are passed from switch 136 (in a closed position) through a conductor 152 to resistor 150. These lower current PMU test signals are passed through the same resistor (resistor 150) that passes the high current PE test signals and the high current PMU test signal (e.g., 50 milliamp). To account for the resistance of resistor 150, the signal level of the lower current PMU test signals may be increased by amplifier 110 or the PMU control circuitry 102. Other techniques may also be implemented to account for the resistance of resistor 150. For example the resistance of resistors 126, 128, 130, and 134 may be reduced (e.g., by 50 Ohm) to account for the resistance of resistor 150. By sharing the use of output stage 108, similar to sharing PE/PMU driver 138, resistor 150 is commonly used to provide PMU and PE test signals to the DUT, and space on IC chip 96 is conserved.

Figure 6:
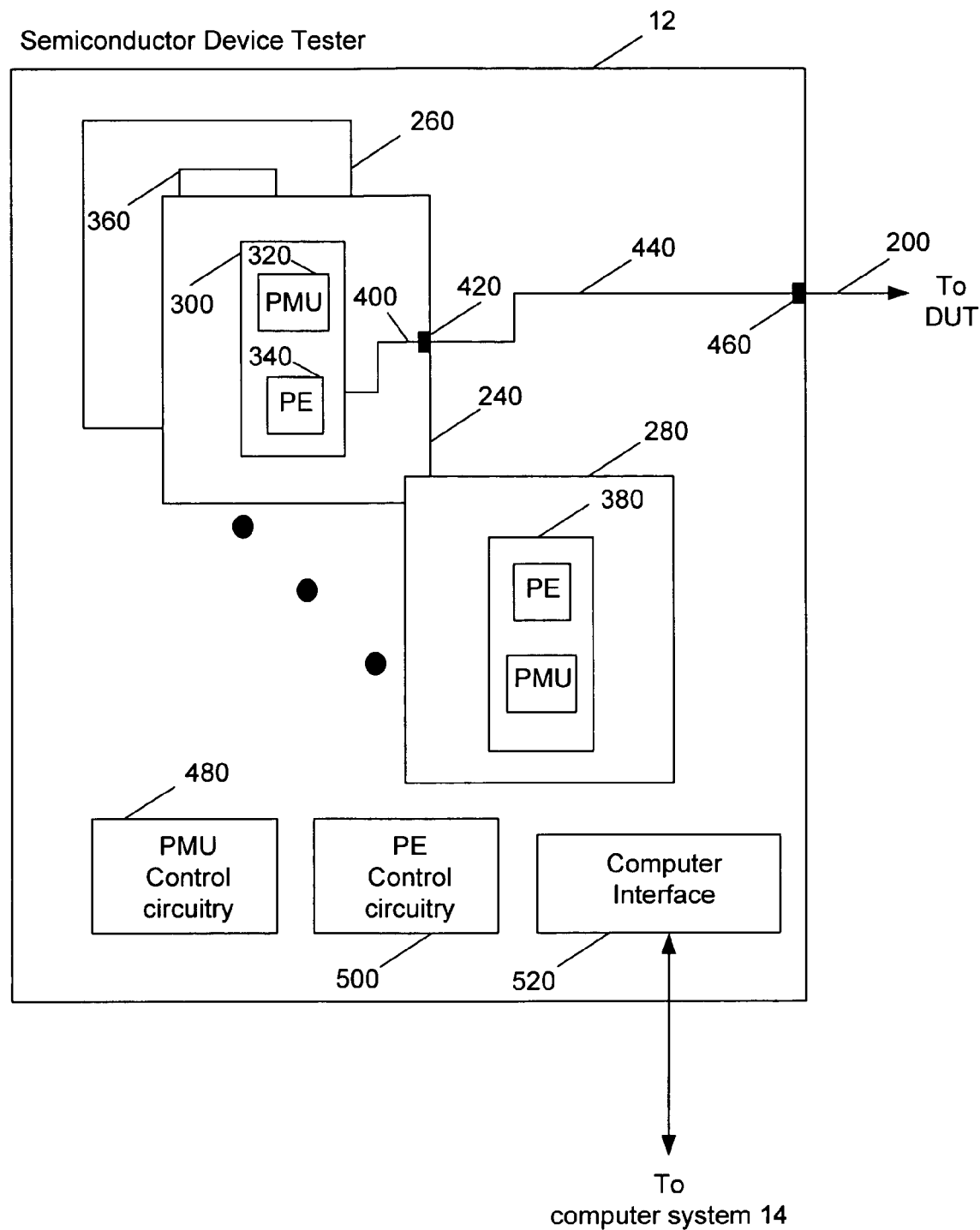
FIG. 6 is a diagrammatic view of another embodiment of the semiconductor device tester included in the system shown in FIG. 1.

Referring to FIG. 6, in another embodiment, semiconductor device tester 12 includes an interface card 240 that can communicate with numerous pins of a DUT (or multiple DUTs). For example, interface card 240 may transmit test signals to, e.g., thirty-two, sixty-four, or one hundred twenty-eight pins and collect the corresponding responses. Each communication link to a pin is typically referred to as a channel and by providing test signals to a large number of channels, testing time is reduced since multiple tests may be simultaneously performed. Along with having many channels on an interface card, by including multiple interface cards in tester 12, the overall number of channels increases, thereby further reducing testing time. In this example, two additional interface cards 260 and 280 are shown to demonstrate that multiple interface cards may populate tester 12.

Each interface card includes a dedicated integrated circuit (IC) chip (e.g., an application specific integrated circuit (ASIC)) for performing particular test functions. For example, interface card 240 includes IC chip 300 for performing parametric measurement unit (PMU) tests and Pin electronics (PE) tests. IC chip 300 respectively has a PMU stage 320 that includes circuitry for performing PMU tests and a PE stage 340 that includes circuitry for performing PE tests. Additionally interface cards 260 and 280 respectively include IC chips 360 and 380 that include PMU and PE circuitry. Typically PMU testing involves providing a DC voltage or current signal to the DUT to determine such quantities as input and output impedance, current leakage, and other types of DC performance characterizations. PE testing involves sending AC test signals and waveforms to a DUT (e.g., IC chip 18) and collecting responses to further characterize the performance of the DUT. For example, IC chip 300 may transmit (to the DUT) AC test signals that represent a vector of binary values for storing on the DUT. Once stored, the DUT is accessed by tester 12 to determine if the correct binary values have been stored. Since digital signals typically include abrupt voltage transitions, the circuitry in PE stage 340 on IC chip 300 operates at a relatively high speed in comparison to the circuitry in PMU stage 320.

To pass both DC and AC test signals and waveforms from interface card 240 to DUT 18, a conducting trace 400 connects IC chip 300 to an interface board connector 420 that allows signals to be passed on and off interface board 240. Interface board connector 420 is also connected to a conductor 440 that is connected to an interface connector 460 that allows signals to be passed to and from tester 12. In this example conductor 200 is connected to interface connector 460 for bidirectional signal passing between tester 12 and pin 22 of IC chip 18. In some arrangements an interface device may be used to connect one or more conductors from tester 12 to the DUT. For example, the DUT (e.g., IC chip 18) may be mounted onto a device interface board (DIB) for providing easy access to each DUT pin. In such an arrangement, conductor 200 may be connected to the DIB for placing test signals on the appropriate pin(s) (e.g., pin 22) of the DUT.

In this example only conducting trace 400 and conductor 440 respectively connect IC chip 300 and interface board 240 for delivering and collecting signals. However, IC chip 300 (along with IC chips 360 and 380) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIB's for interfacing the channels provided by interface cards 240, 260, and 280 to one or multiple devices under test.

To initiate and control the testing performed by interface cards 240, 260, and 280, tester 12 includes PMU control circuitry 480 and PE control circuitry 500 that provide test parameters (e.g., test signal voltage level, test signal current level, digital values, etc.) for producing test signals and analyzing DUT responses. Tester 12 also includes a computer interface 520 that allows computer system 14 to control the operations executed by tester 12 and also allows data (e.g., test parameters, DUT responses, etc.) passing between tester 12 and computer system 14.

As mentioned, PMU testing typically involves sending DC test signals to the DUT and collecting response signals. For example, test signals may be sent to provide a particular DC current or DC voltage to the DUT. Typically, when these test signals are produced with circuitry in PMU stage 320, the desired current and voltage levels are not instantaneously achieved and time is needed for these signals to settle at their predefined levels. Due to this signal settling period, additional time is needed to perform a PMU test. Multiplying this delay time by the number of PMU tests being performed on a DUT (or a group of DUTs), significant testing time is lost. This lost testing time correspondingly reduces manufacturing efficiency and increases manufacturing costs.

Figure 7:
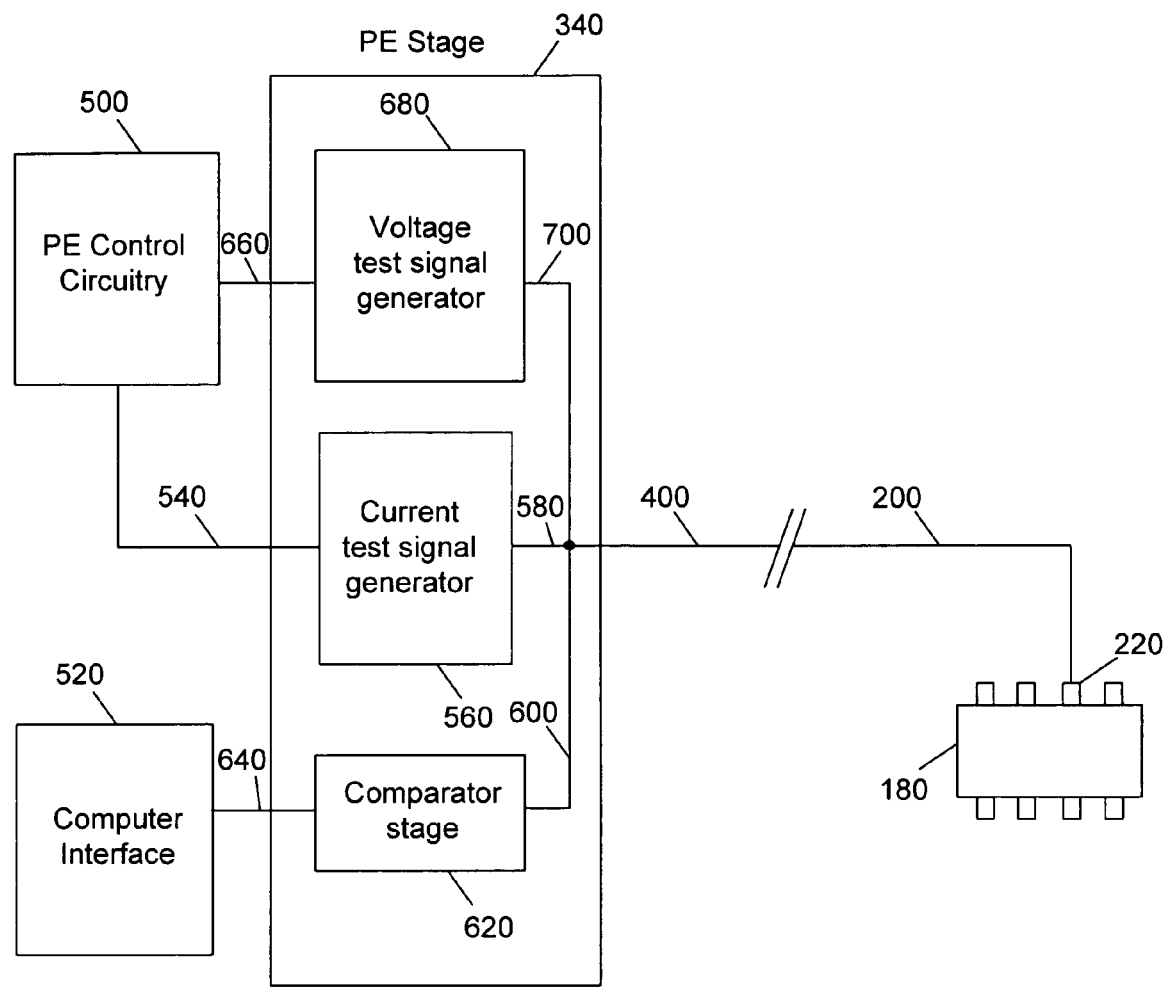
FIG. 7 is a diagrammatic view of PE stage configured to provide PMU test signals from the tester shown in FIG. 6.

Referring also to FIG. 7, to reduce PMU testing time, the relatively high-speed PE stage 340 is used to perform some PMU tests by producing PMU test signals. By producing PMU test signals with PE stage 340, signal settling time decreases along with testing time. Additionally, PE stage 340 is used to collect response signals from the DUT(s) being provided the PMU test signals. In particular, PE stage 340 is used to produce PMU test signals that provide a particular current signal to the DUT. Along with providing the PMU test signal, PE stage 340 also senses a voltage at the DUT that is produced in response to the current test signal. By using the high-speed circuitry of PE stage 340 (compared to PMU stage 320), PMU test signals are produced relatively quickly and testing time is reduced. By reducing testing time, time is conserved and may be used for testing additional DUTs and thereby improve manufacturing efficiency.

To initiate a PMU test with PE stage 340, PE control circuitry 500 sends a control signal over conductor 540 to a current test signal generator 56 that is included in PE stage 340. Typically current test signal generator 560 uses the control signal for setting the current level of an output signal that is sent to the DUT. For example, the control signal may direct current test signal generator 560 to output a fifty milliamp DC current signal over conductor 580 for delivery to pin 220 of IC chip 18 (via conducting trace 400 and conductors 440 and 200).

Along with sending DC test current signals, PE stage 340 also collects response signals from the DUT after injecting the PMU test signal. For example, after providing a DC current test signal, a voltage signal may be sensed at pin 220 and sent to PE stage 340 over the same conductors (i.e., conductors 200 and 440, and conducting trace 400) that provided the current signal to the DUT. Upon receiving the voltage signal, a conductor 600 provides the signal to a comparator stage 620 included in PE stage 340. By comparing the voltage signals to predefined voltages, comparator stage 620 is capable of determining the DC voltage level of the response signal sensed at the DUT. Upon determining the level of the DC voltage signal sensed at the DUT, comparator stage 620 passes representative data over a conductor 640 to computer interface 520 that passes the data to a computer system (e.g., computer system 14) or another type of digital device (e.g., a personal digital assistant (PDA), a cellular telephone, etc.) or a network (e.g., the Internet).

While PE stage 340 provides PMU test signals for reducing PMU testing times, the stage also provides PE testing functions. For example, PE control circuitry 500 may send a control signal over a conductor 660 to a voltage test signal generator 680 that is included in PE stage 340. Voltage test signal generator 680 produces PE test signals such as AC waveforms that are sent over a conductor 700 (along with conducting trace 400 and conductors 440 and 200) to the DUT. Similar to providing PMU test signals, the DUT may produce signals in response to the PE test signals. Some of these response signals may be received by PE stage 34 via conductors 200, 440, and conducting trace 400. Upon receiving the signals, they may be sent over conductor 600 to comparator stage 620 for analysis. For example, an AC signal may be received by PE stage 340 in response to an AC signal sent from voltage test signal generator 680. Arriving at comparator stage 620, this AC response signal may be compared to a predefined voltage level determine if the signal is above or below the voltage. Once determined, data representing the comparison may be sent over conductor 640 to computer interface 520 for further analysis by a computer system such as computer system 14.

Figure 8:
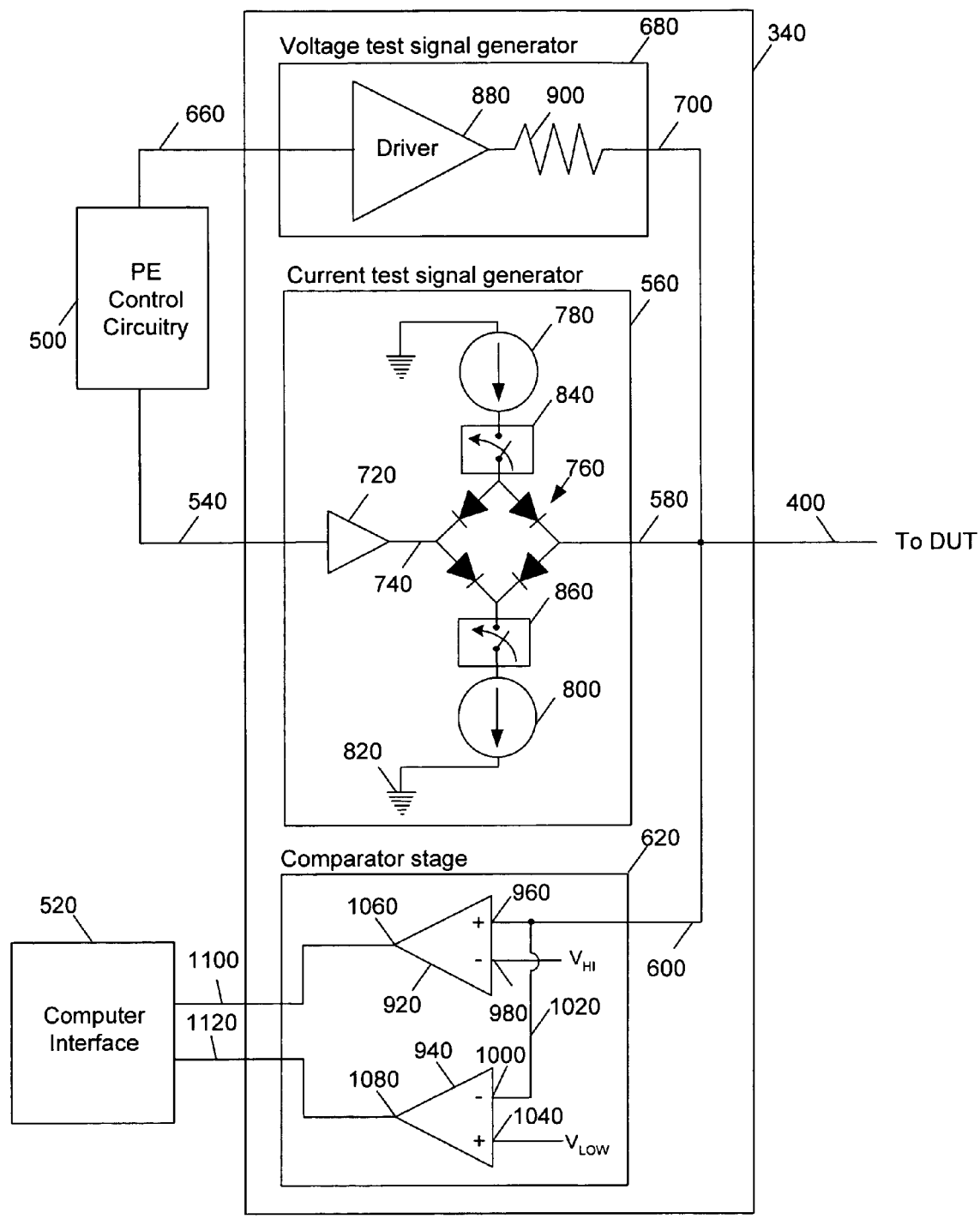
FIG. 8 is an exemplary circuit diagram of the PE stage shown in FIG. 7.

Referring also to FIG. 8, exemplary circuitry for PE stage 340 is presented that includes voltage test signal generator 680, current test signal generator 560, and comparator stage 620. Along with providing PE test signals to a DUT, PE stage 340 provides PMU test signals to reduce PMU testing time. In particular, current test signal generator 560 is used to produce PMU current test signals that are sent to the DUT (e.g., IC chip 18) over conductor 580 and conducting trace 400. In response to receiving a DC current test signal, a voltage response signal is produced by the DUT. For example, by forcing a current test signal into pin 220, a voltage signal may be produced at pin 220 due to the input impedance of the DUT. This voltage signal at pin 220 is provided to PE stage 340 via conductors 200, 440, and conducting trace 400. When a signal is provided by the DUT, current test signal generator 560 and voltage test signal generator 680 are placed in a high output impedance mode. Due to the high output impedance mode, the voltage signal is provided over conductor 600 to comparator stage 620 and is not received by current test signal generator 560 and voltage test signal generator 680. Comparator stage 620 determines the level of the voltage signal from the DUT and provides a signal to computer interface 520 that identifies this voltage level. As mentioned, the circuitry used for PE testing operates at relatively high speeds to provide e.g., digital test signals to the DUT and to collect corresponding response signals from the DUT. By using this high speed circuitry of PE stage 340 for PMU testing, PMU tests are executed faster and testing time is conserved additional operations such as more PMU and PE tests.

To provide current test signals, PE control circuitry 500 sends a signal over conductor 540 to current test signal generator 560. In this example, conductor 540 provides the signal from PE control circuitry to an amplifier 720 that conditions (e.g., amplifies) the signal and sends it over a conductor 740 to a diode bridge 760. The signal received by diode bridge 760 is used to bias the diodes included in the bridge and control the current signal provided by generator 560. By biasing diode bridge 760, current may flow from a current source 780 to conductor 580 or current may flow from conductor 580 to a second current source 800 that is connected to a ground terminal 820. Since generator 560 provides bi-directional current flows by using current source 780 and current source 800, PE control circuitry 500 can modulate the current signal sent to the DUT by controlling the bias of diode bridge 760. By providing modulated current signals, tester 12 may provide a variety of AC signals to the DUT for PE testing. Current test signal generator 560 also includes two switches 840 and 860 that respectively control current flow from current source 780 or to current source 800. For example, if switch 840 is closed, current source 780 is connected to diode bridge 760 and may send a current signal to the DUT via conductor 580. Similarly, if switch 860 is closed, current source 800 is connected to diode bridge 760 and may draw current through conductor 580. If switch 840 or 860 is open, the corresponding current source 780 or 800 is isolated from diode bridge 760.

To provide a voltage test signal to the DUT for PE tests, PE control circuitry 500 sends a test signal (e.g., AC signal, digital signal, etc.) to voltage test signal generator 680 over conductor 660. Conductor 660 provides the signal to a driver 880 (e.g., amplifier circuit) that conditions (e.g., amplifies) the signal and sends a voltage test signal to a resistor 900. The resistance of resistor 900 is selected for impedance matching. To deliver the voltage test signal to the DUT, resistor 900 is connected to conductor 700 that connects to conducting trace 400.

To provide a DC current signals for PMU testing, in one scenario, PE control circuitry 500 provides a signal to amplifier 720 for biasing diode bridge 760. The signal from amplifier 720 biases diode bridge 760 such that current passes through the bridge substantially un-modulated (to produce a DC current signal). In one example, switch 840 is closed and current source 780 provides current to diode bridge 760. Since the current is not modulated, a substantially DC current signal is sent over conductor 580 to conducting trace 400 for delivery to the DUT (e.g., IC chip 18). In other test scenarios, current source 800, or a combination of current sources 780 and 800 may provide a DC current test signal to the DUT.

Upon receiving the DC current test signal from signal generator 560, a voltage signal is produced at the DUT (e.g., pin 220 of IC chip 18). This voltage signal is provided from the DUT to conducting trace 400 (via conductors 200 and 440). Since the output impedance of the voltage test signal generator 680 and the current test signal generator 560 is relatively large, these stages are isolated and the voltage signal is provided to comparator stage 620 for analysis. For one analysis, the voltage signal is compared to one voltage level (i.e., $V_{HI}$) and a lower voltage level (i.e., $V_{LOW}$). By performing the comparison, comparator stage 620 may determine if the voltage signal on conductor 600 is greater than $V_{HI}$, less than $V_{LOW}$, or is between $V_{HI}$ and $V_{LOW}$. By assigning voltages to $V_{HI}$ and $V_{LOW}$ that are slightly different, the value of the voltage signal may be approximately determined. For example, $V_{LOW}$ may be set to 0.65 volt and $V_{HI}$ may be set to 0.75 volt. If comparator stage 620 determines that the voltage signal from the DUT is between $V_{HI}$ and $V_{LOW}$, a voltage level of 0.7 volt may be used to approximately characterize the voltage signal. If comparator stage 620 determines that the voltage signal is less than $V_{LOW}$ or greater than $V_{HI}$, new voltages may be assigned to $V_{LOW}$ and $V_{HI}$. For example, $V_{LOW}$ and $V_{HI}$ may be increased or decreased by the same amount to retain the detection window width. Alternatively $V_{LOW}$ and $V_{HI}$ may adjusted to widen or narrow the detection window. These adjusted voltages for $V_{LOW}$ and $V_{HI}$ may then be compared to voltage signal to approximate the voltage level of the signal. In some arrangements, adjustments to $V_{LOW}$ and $V_{HI}$ and comparing the voltages is executed in an iterative fashion to approximate the voltage signal from the DUT.

In this example, comparator stage 620 includes two operational amplifiers 920, 940 for approximating the voltage of the voltage signal on conductor 600 from the DUT. Operational amplifier 920 is provided the voltage signal on a non-inverting input 960 and $V_{HI}$ on an inverting input 980. Similarly operational amplifier 940 is provided the voltage signal on an inverting input 1000 (over a conductor 1020) and $V_{LOW}$ on a non-inverting input 1040. Operational amplifier 920 provides a signal at an output 1060 that identifies if the voltage signal is greater than or less than $V_{HI}$. Similarly operational amplifier 940 provides a signal at an output 1080 that identifies if the voltage signal is greater than or less than $V_{LOW}$. In this example, both of these signals are sent to computer interface 520 over respective conductors 1100 and 1120. By providing these signals to computer interface 520, data representing the comparison performed by comparator stage 620 may be provided to other portions of tester 12 and computer system 14. Based on this data, the voltage signal from the DUT may be approximated if the voltage is between $V_{LOW}$ and $V_{HI}$. If the signal voltage is greater than $V_{HI}$ or less than $V_{LOW}$, computer system 14 or tester 12 may initiate adjustments to $V_{LOW}$ and/or $V_{HI}$ and execute another comparison of the voltage signal. However, since PE stage 340 operates at higher speeds compared to a PMU stage, by performing PMU testing with PE stage 340 testing efficiency increases and testing time is reduced.

Figure 9:
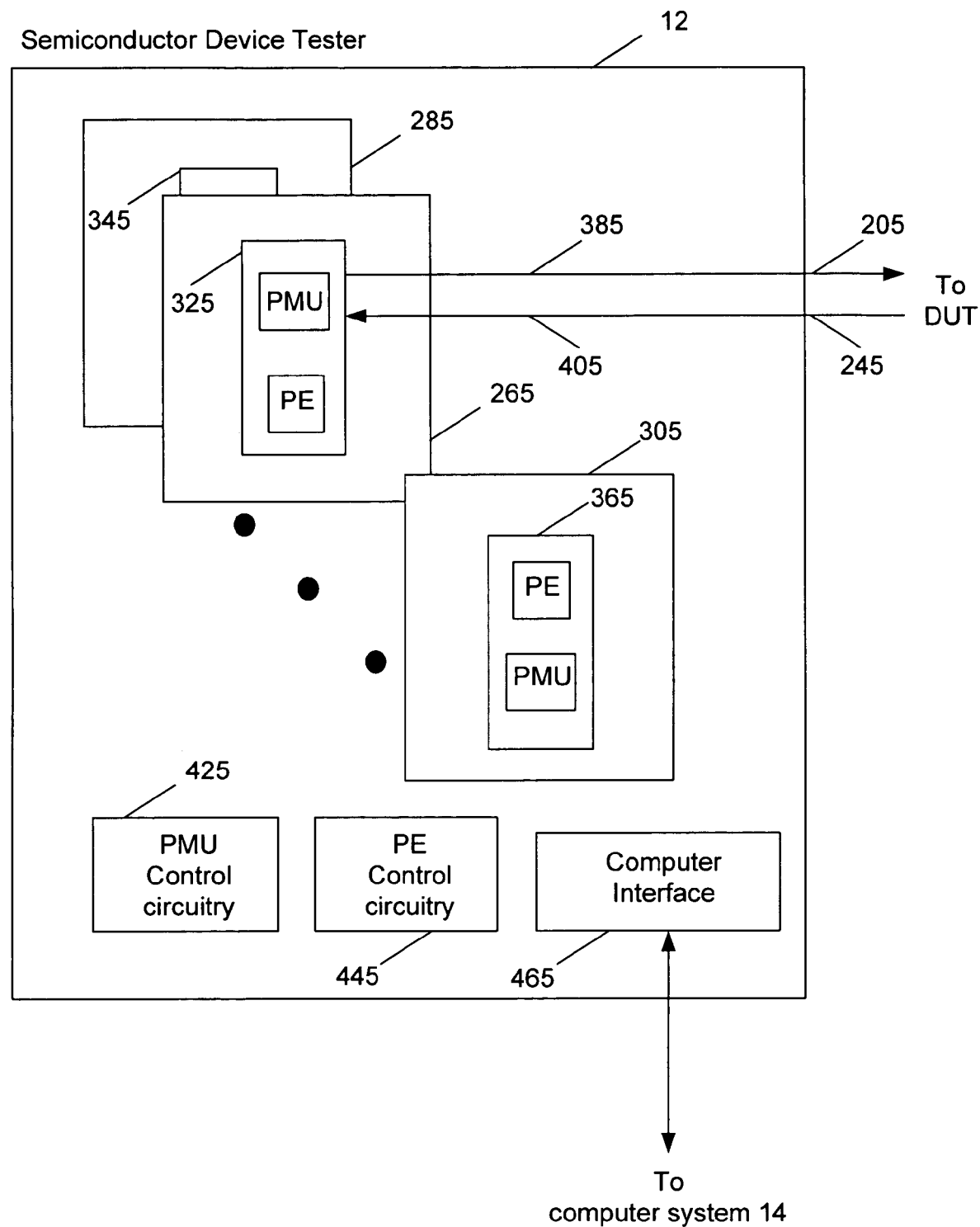
FIG. 9 is a diagrammatic view of another embodiment of a semiconductor device tester.

Referring to FIG. 9, in some embodiments semiconductor device tester 12 includes an interface card 265 that is capable of communicating with numerous pins of a DUT (or multiple DUTs). For example, interface card 265 may initiate transmitting test signals to, e.g., thirty-two, sixty-four, or one hundred twenty-eight pins and collecting the corresponding responses. Each communication link to a pin is typically referred to as a channel and by providing a large number of channels, testing time is reduced. Along with having many channels on an interface card, by including multiple interface cards in tester 12, the overall number of channels increases thereby further reducing testing time. In this example, two additional interface cards 285 and 305 are shown to demonstrate that multiple interface cards may populate tester 12.

Each interface card includes a dedicated integrated circuit (IC) chip (e.g., an application specific integrated circuit (ASIC)) for performing particular test functions. For example, interface card 265 includes IC chip 325 for performing PMU and PE tests. Additionally interface cards 285 and 305 respectively include IC chips 345 and 365 that provide PMU and PE testing. Typically PMU testing involves providing a DC voltage or current signal to the DUT to determine such quantities as input and output impedance, current leakage, and other types of DC performance characterizations. PE testing involves sending AC test signals and waveforms to a DUT (e.g., IC chip 18) and collecting responses to further characterize the performance of the DUT. For example, IC chip 325 may initiate transmitting (to the DUT) AC test signals that represent a vector of binary values for storing on the DUT. Once stored, the DUT is accessed by tester 12 to determine if the correct binary values have been stored. Since digital signals typically include abrupt voltage transitions, the PE circuitry on IC chip 325 operates at a relatively high speed in comparison to the PMU circuitry on IC chip 325.

To pass both DC and AC test signals and waveforms from interface card 265 to DUT 18, a pair of conducting traces 385, 405 connect IC chip 325 to respective conductors 205 and 245. In some arrangements an interface device may be used to connect conductors 205 and 245 to the DUT. For example, the DUT (e.g., IC chip 18) may be mounted onto a device interface board (DIB) such that each DUT pin is easily accessible. In such an arrangement, conductors 205 and 245 may respectively connect to the DIB for placing test signals on the appropriate pin(s) of the DUT.

In this example only two conductors 385, 405 respectively connect IC chip 325 to conductors 205 and 245 for delivering and collecting signals. However, IC chip 325 (along with IC chips 345 and 365) typically has multiple pins (e.g., eight, sixteen, etc.) that are respectively connected with multiple conductors to the DIB. Additionally, in some arrangements, tester 12 may connect to two or more DIB's in order to interface the channels provided by interface cards 265, 285, and 305 to one or multiple devices under test.

To initiate and control the testing performed by interface cards 265, 285, and 305, tester 12 includes PMU control circuitry 425 and PE control circuitry 445 that provide test parameters (e.g., test signal voltage level, test signal current level, digital values, etc.) for producing test signals and analyzing DUT responses. Tester 12 also includes a computer interface 465 that allows computer system 14 to control the operations executed by tester 12 and also allows data (e.g., test parameters, DUT responses, etc.) passing between tester 12 and computer system 14.

Figure 10:
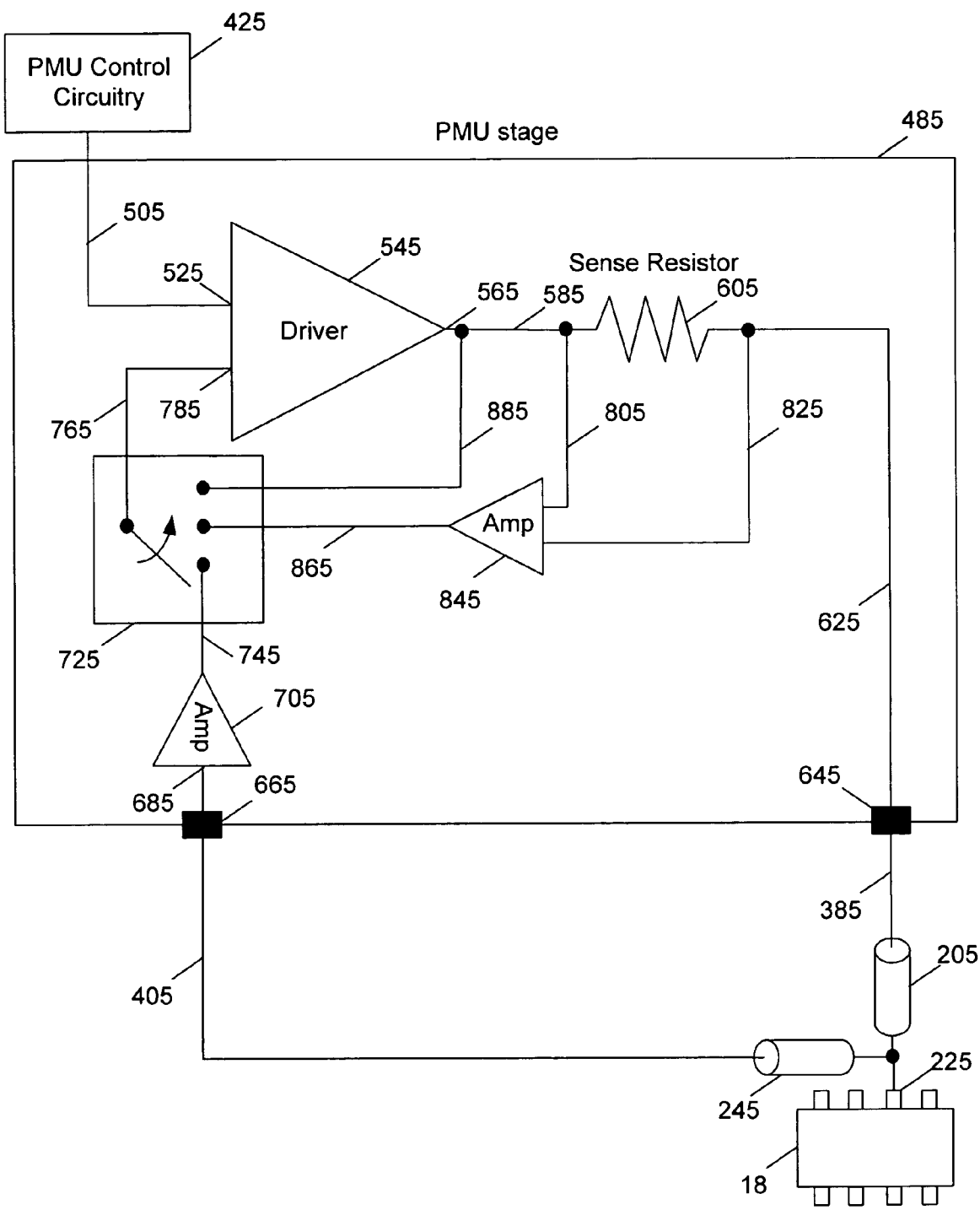
FIG. 10 is a diagrammatic view of PMU stage that includes a feedback circuit for reducing PMU testing time.

Referring to FIG. 10, a portion of IC chip 325 is shown that includes a PMU stage 485 for performing PMU testing. To initiate sending a PMU test signal to DUT 18, PMU control circuitry 425 sends a DC signal over conducting trace 505 to an input 525 of a driver circuit 545 that conditions (e.g., amplifies) the signal and sends it to an output 565. For example, PMU control circuitry 425 may provide a 3-volt DC signal to input 525. Using this input signal, driver circuit 545 may apply a unity gain and provide a 3-volt DC signal at the high-impedance output 565. To send the 3-volt DC signal to IC chip 18 for PMU testing, a conductor 585 is connected to output 565. Conductor 585 is connected to a sense resistor 605 that is used to monitor PMU test signals sent to the DUT. Sense resistor 605 is also connected to a conductor 625 that provides the 3-volt DC test signal to an interface connector 645 that allows the test signal to exit IC chip 325. In this example, interface connector 645 is connected to conductor 385 that provides the PMU test signal to pin 225 of IC chip 18 via conductor 205.

In this example, a 3-volt DC signal is provided by semiconductor device tester 12 to pin 225 for performing PMU testing. However, if IC chip 18 draws current from this signal, voltage drops are produced by impedances that are present between driver circuit 545 and IC chip 18. For example, if current flows into pin 225, a voltage drop is produced across sense resistor 605. Additionally, resistance present in interface connector 645 and/or conductors 625, 385, and 205 may produce voltage drops due to this current flow. Due to these voltage drops, the level of the 3-volt DC signal at pin 225 reduces compared to the test signal provided by PMU control circuitry 425 to input 525 of driver circuit 545. For example, due to current drawn by IC chip 18, the DC signal at pin 225 may be substantially less (e.g., 1-volt) than the 3-volt DC signal present at input 525 of driver circuit 545.

To compensate for voltage drops experienced between driver circuit 545 and IC chip 18 (or another DUT), semiconductor device tester 12 includes circuitry for detecting signal loss and for appropriately adjusting the output of driver circuit 545. For example, if the test signal at pin 225 has reduced to a 2-volt signal, tester 12 detects this 1-volt signal loss and adjusts the output of driver circuit 545 so that the desired 3-volt signal is delivered to IC chip 18. To detect this signal loss at the DUT, one conventional technique monitors the test signal present at the DUT and adjusts the output of driver circuit 545 to compensate for the detected signal loss. In this example, to monitor the PMU test signal provided to IC chip 18, conductor 245 is connected to pin 225. By monitoring the test signal present at pin 22, a feedback signal may be sent to driver circuit 545 for adjusting its output. In particular, the feedback signal is passed from conductor 245 to conductor 405 that is connected to an interface connector 665. Interface connector 665 provides the feedback signal to the internal circuitry of IC chip 325. In this example, the feedback signal is passed to an input 685 of a buffer amplifier 705 (e.g., a unity gain amplifier) so that minimal current is drawn through conductors 245 and 405 and interface connector 665. While buffer amplifier 705 is incorporated into IC chip 325, in other arrangements buffer amplifier 705 may be located external to IC chip 325. For example, buffer amplifier 705 may be located on interface card 265 or near to the DUT.

Buffer amplifier 705 passes the feedback signal through a conductor 745 to a switch 725 that controls from which source feedback is provided to driver circuit 545. Typically tester 12 or computer system 14 controls which position switch 725 is placed. If switch 725 is placed into a position that connects conductor 745 and a conductor 765, the feedback signal from pin 225 is provided to an input 785 of the driver circuit 545. By providing this feedback signal, driver circuit 545 can determine the difference between the feedback signal and the test signal provided by PMU control circuitry 425 (at input 525). For example, if the feedback signal is a 2-volt DC signal and the signal from PMU control circuitry 425 is a 3-volt DC signal, driver circuit 545 compares the signals to determine that 1-volt is loss during transmission to pin 225. To compensate for this loss, driver circuit 545 may adjust its output so that a 4-volt DC signal is provided from output 565. Correspondingly, due to the losses between driver circuit 54 and the DUT, the 4-volt signal is reduced to a 3-volt DC signal at pin 225. So, by monitoring the signal present at pin 225 and appropriately adjusting the output of driver circuit 545, the desired test signal is provided to the DUT.

Another conventional technique to monitor the PMU test signal being provided to the DUT is to monitor the current being drawn by the DUT. By monitoring this current flow, the output of driver circuit 54 may be adjusted to compensate for voltage drops due to this drawn current. To provide this monitoring technique, a pair of conductors 805, 825 is connected across sense resistor 605 to detect the voltage across the resistor. Thereby, if pin 225 draws current through conductors 205, 385, and 625, voltage is detected across sense resistor 605. Conductors 805 and 825 provide this voltage drop present across sense resistor 605 to a buffer amplifier 845 that provides a DC signal representing the voltage drop across sense resistor 605. A conductor 865 passes the DC signal from the output of buffer amplifier 845 to switch 725. If switch 725 is closed (by tester 12 or computer system 14) to connect conductor 865 and conductor 765, the DC signal from buffer amplifier 845 is provided to input 785 of driver circuit 545. Similar to the DC signal that may be present on conductor 745 (from pin 225), the feedback signal present on conductor 865 is used by driver circuit 545 for adjusting its output to compensate for the current being drawn by the DUT.

By monitoring PMU test signals with a feedback signal that is detected at sense resistor 605 or the DUT (e.g., pin 225), driver circuit 545 can accurately adjust for signal losses between the driver circuit and the DUT. However, these both of these feedback signals are sent across considerable distances prior to being received by switch 725. For example, the DC voltage signal detected at pin 225 is sent over conductors 245, 405, and 745, along with being passed through interface connector 665 and buffer amplifier 705. To monitor the voltage across sense resistor 605, the feedback DC voltage signal is passed through conductors 805, 825, and 865, along with being passed through buffer amplifier 845. These transmission distances cause a time delay for adjusting the output of driver circuit 545 for an appropriate test signal. Correspondingly, due to this time delay, additional time is needed for performing a PMU test. Furthermore as more devices are tested, considerable testing time is lost.

To reduce the time for driver circuit 545 to provide an appropriate DC test signal, PMU stage 485 includes a feedback circuit to monitor signals at output 565 of driver circuit 545 and provides a feedback signal to switch 725. By monitoring the signals at output 565, the time needed to provide a feedback signal to driver circuit 545 is significantly reduced. By reducing the time to provide a feedback signal, driver circuit 545 relatively quickly adjusts its output for current drawn by the DUT. In this example, the feedback circuit is provided by a conductor 885 that is connected to output 565 of driver circuit 545 and to switch 725. When switch 725 is closed (thus connecting conductor 885 to conductor 765), the signal present at output 565 is provided to input 785 of driver circuit 545. Accordingly, if the DC test signal present at output 565 is reduced (e.g., a 2-volt DC signal) due to current drawn by IC chip 18, driver circuit 545 can relatively quickly adjust the output signal so that the desired test signal (e.g., a 3-volt DC signal) is received at pin 225.

In this example, conductor 885 provides a feedback signal from output 565 to switch 725, however in other arrangements other circuitry may be implemented to provide the feedback circuitry. For example, a buffer amplifier may be connected along conductor 885 to reduce current being drawn by the conductor. Also, conductor 885 may be directly connected from output 565 to input 785. By removing switch 725, propagation delays are further reduced. However, the inclusion of switch 725 and the circuitry for monitoring voltage signals across sense resistor 605 and/or at pin 225 allows for accurate feedback signals to be detected at (or near) the DUT. However, monitoring the PMU test signals at sense resistor 605 and pin 225 increases the time needed for driver circuit 545 to adjusts the driver circuit output along with increasing the overall PMU testing time.

A number of implementations have been described. Nevertheless, it will be understood that various modifications may be made. Accordingly, other implementations are within the scope of the following claims.

What is claimed is:

1. A semiconductor device tester, comprising:
    a PMU stage configured to provide a DC test signal, the DC test signal comprising one of plural test signals, at least two of the plural test signals having different current levels;
    a PE stage configured to produce an AC test signal;
    a driver circuit configured to provide, in a first mode, a version of the DC test signal in a case that the DC test signal is for producing a test signal having a higher current level than others of the plural test signals and, in a second mode, to provide a version of the AC test signal; and
    an output stage through which test signals pass on a path to a semiconductor device;
    wherein, in a case that the DC test signal is for producing a test signal having less than the higher current level, the DC test signal passes to the output stage through circuitry that bypasses the driver.

2. The semiconductor device tester of claim 1, wherein the output stage comprises impedance circuitry.

3. The semiconductor device tester of claim 1, wherein the version of the DC test signal provided by the driver circuit is an amplified version of the DC test signal provided by the PMU stage.

4. The semiconductor device tester of claim 1, wherein the version of the AC test signal provided by the driver circuit is an amplified version of the AC test signal produced by the PE stage.

5. The semiconductor device tester of claim 1, wherein the output stage comprises a resistor.

6. The semiconductor device tester of claim 1, wherein the DC test signal has a current of approximately 50 milliamp.

7. The semiconductor device tester of claim 2, wherein circuitry that bypasses the driver comprises a switch through which the DC test signal passes to the output stage.

8. A semiconductor device tester, comprising:
   a PMU stage configured to provide a DC test signal, the DC test signal comprising one of plural test signals, each of the plural test signals having a different current level than others of the plural test signals;
   a PE stage configured to produce an AC test signal;
   a circuit configured to pass, in response to a control signal, either (i) a version of the DC test signal in a case that the DC test signal is for producing a test signal having a higher current level than others of the plural test signals, or (ii) a version of the AC test signal; and
   an output stage through which test signals pass;
   wherein, in a case that the DC test signal is for producing a test signal having less than the higher current level, the DC test signal passes to the output stage through circuitry that bypasses the circuit.

9. The semiconductor device tester of claim 8, wherein the circuit comprises a driver circuit configured to provide signal amplification.

10. The semiconductor device tester of claim 8, wherein the circuitry comprises a switch configured to provide DC test signal to the output stage.

11. The semiconductor device tester of claim 8, wherein the output stage includes a resistor.

12. The semiconductor device tester of claim 8, wherein the PMU stage, the PE stage, the circuit, and the output stage comprise an integrated circuit.

13. The semiconductor device tester of claim 8, wherein the version of the AC test signal comprises an amplified version of the AC test signal produced by the PE stage and the version of the DC test signal comprises an amplified version of the DC test signal provided by the PMU stage.

14. The semiconductor device tester of claim 13, where the amplified version of the DC test signal has a relatively high current.

15. The semiconductor device tester of claim 13, wherein the output stage includes a 50 Ohm resistor.

16. A method of providing test signals to a semiconductor device, comprising:
   producing a DC test signal using a PMU stage;
   in a case that the DC test signal is for producing a DC test signal having a current level that is greater than a predefined current level, amplifying the DC test signal using a driver circuit that is also configured to amplify an AC test signal from a PE stage;
   causing the DC test signal to bypass the driver circuit if the DC test signal is to have a current level that is less than the predefined current level; and
   sending the DC test signal or the amplified DC test signal through an output stage to the semiconductor device under test, wherein the output stage is also configured to provide an amplified AC test signal from the PE stage to the semiconductor device.

17. The method of claim 16, wherein sending the amplified DC test signal through the output stage includes passing the amplified DC test signal through a resistor.

18. The method of claim 16, wherein causing the DC test signal to bypass the driver circuit comprises: passing the DC test signal through a switch.

19. The method of claim 18, wherein passing the DC test signal through the switch includes placing the switch in a closed position.

* * * * *